United States Patent
Jung

(10) Patent No.: US 7,675,331 B2
(45) Date of Patent: Mar. 9, 2010

(54) POWER-UP SIGNAL GENERATING CIRCUIT AND METHOD FOR DRIVING THE SAME

(75) Inventor: Ho-Don Jung, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 74 days.

(21) Appl. No.: 12/003,677

(22) Filed: Dec. 31, 2007

(65) Prior Publication Data

US 2008/0238500 A1    Oct. 2, 2008

(30) Foreign Application Priority Data

Mar. 31, 2007    (KR) .................... 10-2007-0032058

(51) Int. Cl.
*H03K 5/153* (2006.01)
(52) U.S. Cl. .................. 327/143; 327/142; 327/198
(58) Field of Classification Search .............. 327/142, 327/143, 198
See application file for complete search history.

(56) References Cited

U.S. PATENT DOCUMENTS

| | | | |
|---|---|---|---|
| 4,716,322 A * | 12/1987 | D'Arrigo et al. | 327/143 |
| 6,229,366 B1 * | 5/2001 | Balakirshnan et al. | 327/172 |
| 6,924,709 B2 * | 8/2005 | Bashar | 331/143 |
| 2007/0001721 A1 * | 1/2007 | Chen et al. | 327/143 |

FOREIGN PATENT DOCUMENTS

| JP | 05-022100 | 1/1993 |
|---|---|---|
| KR | 10-20068974 | 6/2006 |

OTHER PUBLICATIONS

Korean Notice of Allowance issued in Korean Patent Application No. KR 10-2007-0032058 dated on Jul. 31, 2008.

* cited by examiner

*Primary Examiner*—An T Luu
(74) *Attorney, Agent, or Firm*—IP & T Law Firm PLC

(57) ABSTRACT

A power-up signal generating circuit that prevents repeatedly generating a power-up signal even when there is noise on an external voltage. The power-up signal generating circuit includes a level detector, a level comparator, and a reentry protector. The level detector is configured to deactivate a first level detection signal when a level of an external voltage increases above a upper limit reference voltage. The level comparator is configured to deactivate a second level detection signal when the level of the external voltage increases above a lower limit reference voltage. The reentry protector is configured to activate the power-up signal in response to the second level detection signal and deactivate the power-up signal in response to a deactivation of the first level detection signal.

17 Claims, 4 Drawing Sheets

US 7,675,331 B2

POWER-UP SIGNAL GENERATING CIRCUIT AND METHOD FOR DRIVING THE SAME

CROSS-REFERENCE TO RELATED APPLICATIONS

This application claims priority to Korean patent application number 10-2007-0032058, filed on Mar. 31, 2007, which is incorporated by reference in its entirety.

BACKGROUND OF THE INVENTION

The subject matter relates to a semiconductor memory device, and more particularly to a power-up signal generating circuit, which does not repeatedly activate a power-up signal when noise is applied to an external voltage, and a method for driving the same.

As semiconductor memory technology has advanced, a core voltage applied to a cell has decreased. In some devices a power-up signal generating circuit is provided to generate a stable power-up signal at an initial operation after an external voltage is applied, even for device with differences in process, voltage, or temperature.

The power-up signal generating circuit generates a power-up signal that is activated when a substrate bias voltage VBB reaches a desired level. The power-up signal is used to control voltage levels of internal circuits until internal voltages reach predetermined levels when a setup is completed.

In a dynamic random access memory (DRAM), a PMOS transistor and an NMOS transistor each have a threshold voltage (Vt). Operation of the DRAM is stabilized when the external voltage reaches 2×Vt, which is a sum of the threshold voltage (Vt) of the PMOS transistor and the threshold voltage (Vt) of the NMOS transistor.

In addition, DRAM operation is more stable when the internal voltages generated by external power sources are higher than a predetermined level. Accordingly, it is very important to accurately maintain an activation timing of the power-up signal.

FIG. 1 is a schematic circuit diagram of a conventional power-up signal generating circuit of a semiconductor memory device.

Referring to FIG. 1, the conventional power-up signal generating circuit includes a voltage divider 10, a level detector 20, and a buffer 30. The voltage divider 10 divides an external voltage VDD to output a divided voltage VDD_D. The level detector 20 detects a level of the divided voltage VDD_D and deactivates a level detection signal DT_LV when the level of the divided voltage VDD_D increases above an upper limit reference voltage VT_DIS. The buffer 30 buffers the level detection signal DT_LV to output a power-up signal PWR_UP.

The level detector 20 includes a PMOS transistor PM1 and an NMOS transistor NM1. The PMOS transistor PM1 has a gate connected to a ground voltage (VSS) terminal, a source connected to an external voltage (VDD) terminal, and a drain connected to an output node. The NMOS transistor NM1 has a gate receiving the divided voltage VDD_D, a drain connected to the output node, and a source connected to the ground voltage (VSS) terminal. The level detector 20 outputs the level detection signal DT_LV through the output node.

The voltage divider 10 includes resistors R1 and R2 connected in series between the external voltage (VDD) terminal and the ground voltage (VSS) terminal. The voltage divider 10 outputs the voltage applied to a common node of the resistors R1 and R2 as the divided voltage VDD_D.

An operation of the conventional power-up signal generating circuit will be briefly described.

The voltage divider 10 outputs the divided voltage VDD_D according to a resistance ratio of the resistors R1 and R2. The divided voltage VDD_D has a level of $(R2/(R1+R2))\times VDD$.

The level detector 20 increases the level detection signal DT_LV along the level of the external voltage VDD while the divided voltage VDD_D outputted from the voltage divider 10 is lower than a threshold voltage. Thereafter, when the level of the external voltage increases above the upper limit reference voltage VT_DIS, the NMOS transistor NM1 is turned on, causing the level detection signal DT_LV to decrease to the ground voltage VSS.

The buffer 30 buffers the level detection signal DT_LV to output the power-up signal PWR_UP. Accordingly, the level of the power-up signal PWR_UP increases along the level of increasing external voltage VDD during an initial operation. Thereafter, the power-up signal PWR_UP is deactivated when the level of the external voltage VDD increases above the level of the upper limit reference voltage VT_DIS, at which point it is considered to be stabilized.

Internal blocks of the semiconductor memory device are initialized in response to the power-up signal PWR_UP.

A malfunction of the power-up signal generating circuit shown in FIG. 1 will be described with reference to FIG. 2.

Referring to FIG. 2, as the level of the external voltage VDD increases during the initial operation, the power-up signal generating circuit increases the level of the power-up signal PWR_UP. The power-up signal PWR_UP is deactivated when the level of the external voltage VDD increases above the level of the upper limit reference voltage VT_DIS.

However, when the external voltage VDD is consumed by the internal blocks of the semiconductor memory device, the level of the external voltage VDD may become unstable around the upper limit reference voltage VT_DIS. In this case, the power-up signal PWR_UP is again activated to the level of the external voltage VDD when the level of the external voltage VDD decreases below the level of the upper limit reference voltage VT_DIS. Such a phenomenon may occur repeatedly when the level of the external voltage VDD decreases below the level of the upper limit reference voltage VT_DIS.

The internal blocks of the semiconductor memory device are repeatedly initialized when the power-up signal is repeatedly activated due to instability of the external voltage VDD. When this occurs, the initialization time is increased and current consumption increases due to this undesired operation.

SUMMARY OF THE INVENTION

Embodiments of the present invention are directed to providing a power-up signal generating circuit which does not repeatedly activate a power-up signal even when there is noise on an external voltage.

In one embodiment, a power-up signal generating circuit includes a level detector configured to deactivate a first level detection signal when a level of an external voltage increases above a first reference voltage, a level comparator configured to deactivate a second level detection signal when the level of the external voltage increases above a second reference voltage, and a reentry protector configured to activate a power-up signal in response to the second level detection signal and deactivate the power-up signal in response to a deactivation of the first level detection signal.

In another embodiment, a method for driving a power-up signal generating circuit includes detecting a level of an external voltage, deactivating a power-up signal, a level of which increases along the level of the external voltage, to a ground voltage level when the level of the external voltage increases above a first reference voltage, and making the power-up signal following the level of the external voltage when the level of the external voltage decreases above a second reference voltage, wherein the second reference voltage has a level lower than the first reference voltage.

In further embodiment, a power-up signal generating circuit includes a first pre-signal generating unit configured to deactivate a first level detection signal when a level of a signal corresponding to an external voltage increases above a first reference voltage, a second pre-signal generating unit configured to deactivate a second level detection signal when the level of the signal increases above a second reference voltage, and a main signal generating unit configured to activate a power-up signal in response to an activation of the second level detection signal, and deactivate the power-up signal in response to a deactivation of the first level detection signal.

DESCRIPTION OF SPECIFIC EMBODIMENTS

Hereinafter, a power-up signal generating circuit in accordance with embodiments of the present invention will be described in detail with reference to the accompanying drawings.

Figure 3:
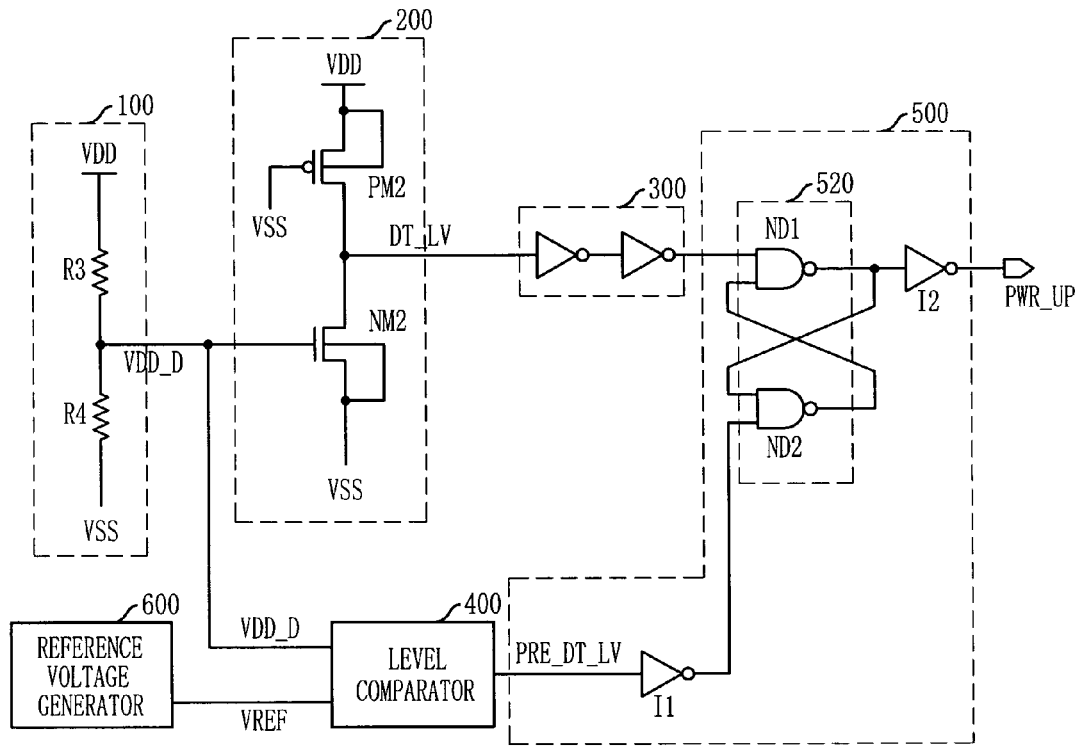
FIG. 3 is a schematic circuit diagram of a power-up signal generating circuit in accordance with an embodiment of the present invention.

FIG. 3 is a schematic circuit diagram of a power-up signal generating circuit in accordance with an embodiment of the present invention.

Referring to FIG. 3, the power-up signal generating circuit includes a first pre-signal generating unit, a second pre-signal generating unit, and a main signal generating unit 500.

The first pre-signal generating unit deactivates a first level detection signal DT_LV when a level of an external voltage VDD increases above a upper limit reference voltage VT_DIS. The second pre-signal generating unit deactivates a second level detection signal PRE_DT_LV when the level of the external voltage VDD increases above a lower limit reference voltage VT_IIS. The main signal generating unit 500 activates a power-up signal PWR_UP to have the same level as the external voltage VDD in response to an activation of the second level detection signal PRE_DT_LV, and deactivates the power-up signal PWR_UP in response to a deactivation of the first level detection signal DT_LV.

The first pre-signal generating unit includes a voltage divider 100 and a level detector 200/300. The voltage divider 100 divides the external voltage VDD to output a divided voltage VDD_D. The level detector 200/300 detects a level of the divided voltage VDD_D and deactivates the first level detection signal DT_LV when the level of the divided voltage VDD_D is greater than a predetermined level.

The second pre-signal generating unit includes the voltage divider 100 and a level comparator 400. The level comparator 400 deactivates the second level detection signal PRE_DT_LV when the level of the divided voltage VDD_D is greater than a reference voltage VREF.

The power-up signal generating circuit further includes a reference voltage generating unit 600, which outputs the reference voltage VREF.

The level detector 200/300 includes a PMOS transistor PM2, an NMOS transistor NM2, and a buffer 300. The PMOS transistor PM2 has a gate connected to a ground voltage (VSS) terminal, a source connected to the external voltage (VDD) terminal, and a drain connected to an output node. The NMOS transistor NM2 has a gate receiving the divided voltage VDD_D, a drain connected to the output node, and a source connected to the ground voltage (VSS) terminal. The buffer 300 buffers a voltage of the output node to output the first level detection signal DT_LV.

The voltage divider 100 includes resistors R3 and R4 connected in series between the external voltage (VDD) terminal and the ground voltage (VSS) terminal. The voltage divider 100 outputs a voltage applied to a common node of the resistors R3 and R4 as the divided voltage VDD_D.

The main signal generating unit 500 includes a first inverter I1, an RS latch 520, and a second inverter I2. The first inverter I1 inverts the second level detection signal PRE_DT_LV. The RS latch 520 receives an output signal of the buffer 300 as a set signal and an output signal of the first inverter I1 as a reset signal. The second inverter I2 inverts an output signal of the RS latch 520 to output the power-up signal PWR_UP.

The RS latch 520 includes NAND gates ND1 and ND2 cross-coupled to each other.

The lower limit reference voltage VT_IIS is at a lower level than that of the upper limit reference voltage VT_DIS. The main signal generating unit 500 generates the power-up signal PWR_UP having the same level as the external voltage VDD in response to the activation of the second level detection signal PRE_DT_LV and deactivates the power-up signal PWR_UP in response to the deactivation of the first level detection signal DT_LV, preventing reactivation of the power-up signal PWR_UP. That is, the main signal generating unit 500 prevents undesired reactivation of the power-up signal PWR_UP.

Figure 4:
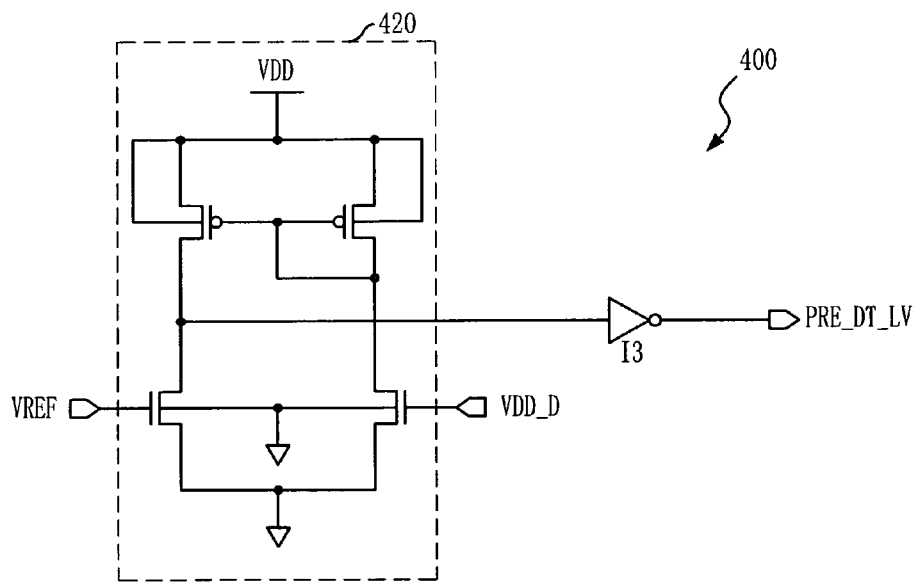
FIG. 4 is a schematic circuit diagram of a level comparator illustrated in FIG. 3.

FIG. 4 is a schematic circuit diagram illustrating the level comparator 400 of FIG. 3.

Referring to FIG. 4, the level comparator 400 includes a differential amplifier 420 and an inverter I3. The differential amplifier 420 receives the reference voltage VREF and the divided voltage VDD_D as differential input signals. The inverter I3 inverts an output signal of the differential amplifier 420 to output the second level detection signal PRE_DT_LV.

Since the differential amplifier 420 of FIG. 4 is well known, a detailed description is omitted.

Figure 5:
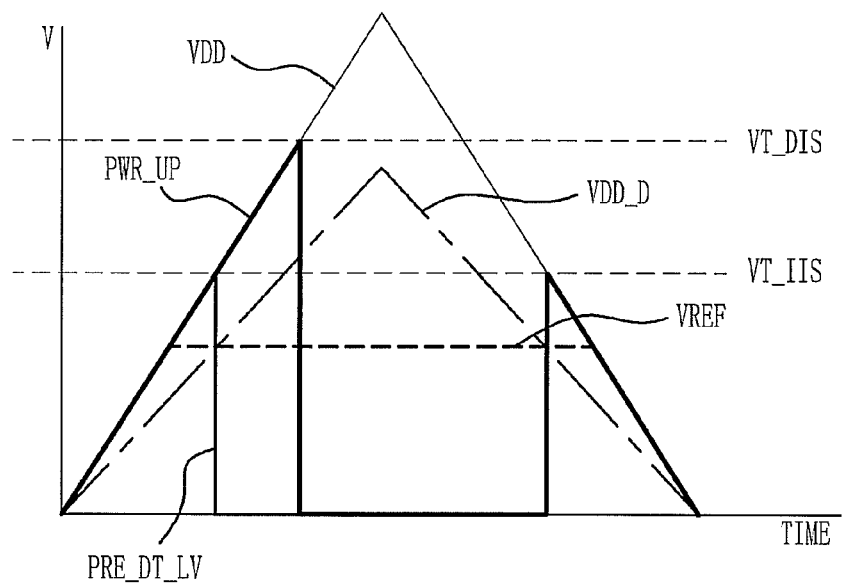
FIG. 5 is a graph illustrating an operation of the power-up signal generating circuit illustrated in FIG. 3.

FIG. 5 is a graph illustrating an operation of the power-up signal generating circuit illustrated in FIG. 3. In particular, a case where the level of the external voltage VDD increases and then decreases will be described below.

The voltage divider 100 outputs the divided voltage VDD_D according to a resistance ratio of the resistors R3 and R4. The divided voltage VDD_D has a level of (R4/(R3+R4))×VDD.

The level detector 200/300 increases the level of the first level detection signal DT_LV along the level of the external voltage VDD when the level of the divided voltage VDD_D is lower than a threshold voltage of the NMOS transistor NM2. The level comparator 400 increases the level of the second level detection signal PRE_DT_LV along the level of the external voltage VDD when the divided voltage VDD_D is lower than the reference voltage VREF.

The main signal generating unit 500 increases the level of the power-up signal PWR_UP along the level of the external voltage VDD in response to the second level detection signal PRE_DT_LV, the level of which increases along the level of the external voltage VDD.

Then, when the divided voltage VDD_D increases above the reference voltage VREF, that is when the external voltage VDD increases above the lower limit reference voltage VT_IIS, the level comparator 400 deactivates the second level detection signal PRE_DT_LV to a logic low level.

Thereafter, when the divided voltage VDD_D increases above the threshold voltage of the NMOS transistor NM2, and external voltage VDD increases above the upper limit reference voltage VT_DIS, the NMOS transistor NM2 is turned on, resulting in the first level detection signal DT_LV being deactivated to a logic low level.

The main signal generating unit 500 deactivates the power-up signal PWR_UP in response to the deactivation of the first level detection signal DT_LV.

Thereafter, when the level of the external voltage VDD again decreases below the upper limit reference voltage VT_DIS, the level detector 200/300 makes the first level detection signal DT_LV follow the level of the external voltage VDD. Thus, the level of the first level detection signal DT_LV again increases from the ground voltage VSS to the external voltage VDD.

Then, when the level of the external voltage VDD decreases below the level of the lower limit reference voltage VT_IIS, the level comparator 400 makes the second level detection signal PRE_DT_LV follow the level of the external voltage VDD. Thus, the level of the second level detection signal PRE_DT_LV again increases from the ground voltage VSS to the external voltage VDD.

The main signal generating unit 500 generates the power-up signal PWR_UP having the same level as the external voltage VDD in response to the activation of the second level detection signal PRE_DT_LV. Thus, the level of the power-up signal PWR_UP changes from the ground voltage VSS to the external voltage VDD.

Hereinafter, the operation of the power-up signal generating circuit illustrated in FIG. 3 will be described in comparison with that of FIG. 1 with respect to the power-up signal PWR_UP and the upper limit reference voltage VT_DIS.

Figure 1:
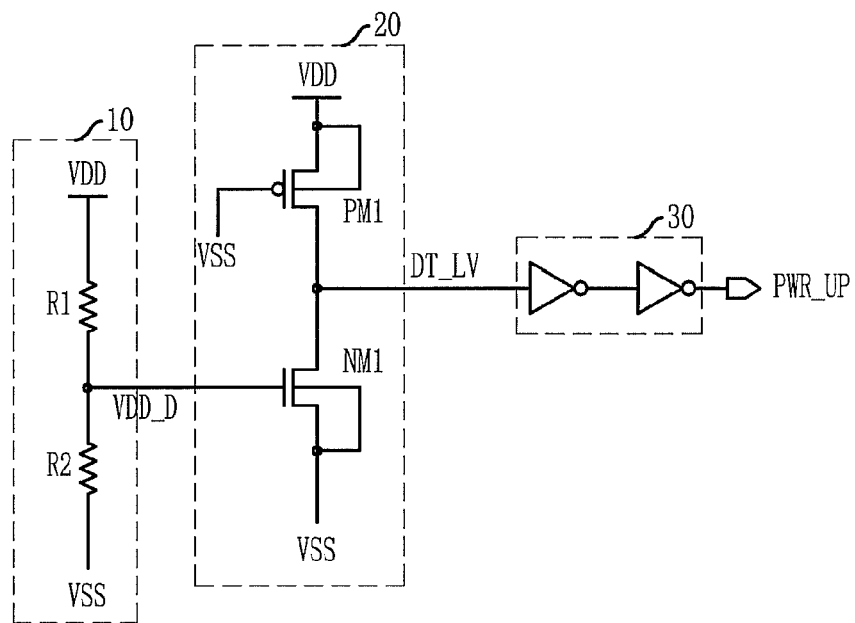
FIG. 1 is a schematic circuit diagram of a conventional power-up signal generating circuit in a semiconductor memory device.
Figure 2:
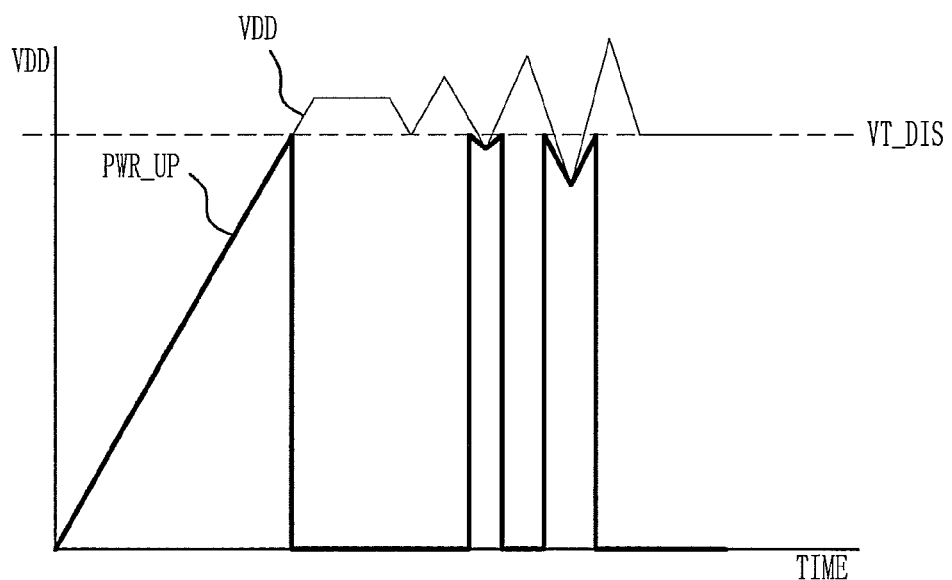
FIG. 2 is a graph illustrating a malfunction of the power-up signal generating circuit of FIG. 1.
Figure 6A:
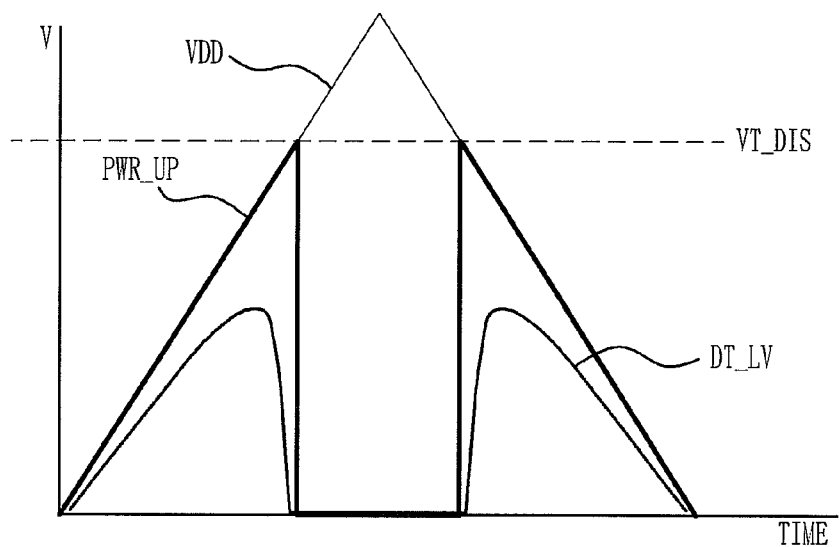
FIG. 6A is a graph illustrating an operation of the conventional power-up signal generating circuit illustrated in FIG. 1.

FIG. 6A is a graph illustrating the operation of the conventional power-up signal generating circuit of FIG. 1. In particular, the power-up signal PWR_UP and the first level detection signal DT_LV according to the level change of the external voltage VDD are shown in FIG. 6A.

As described above, the level of the power-up signal PWR_UP increases along the level of the external voltage VDD while the level of the external voltage VDD is lower than a upper limit reference voltage VT_DIS. The power-up signal PWR_UP is deactivated to the ground voltage VSS when the level of the external voltage VDD is higher than the level of the upper limit reference voltage VT_DIS.

When the level of the external voltage VDD decreases below the level of the upper limit reference voltage VT_DIS, the level of the power-up signal PWR_UP increases from the ground voltage VSS to the external voltage VDD.

Figure 6B:
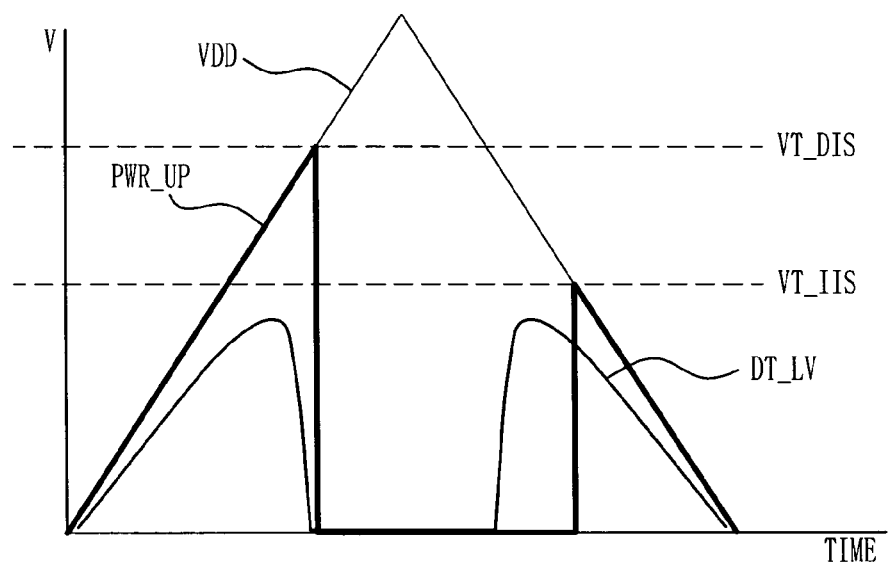
FIG. 6B is a graph illustrating an operation of the power-up signal generating circuit of FIG. 3.

FIG. 6B is a graph illustrating an operation of the power-up signal generating circuit of FIG. 3. In particular, the power-up signal PWR_UP and the first level detection signal DT_LV according to the level change of the external voltage VDD are shown in FIG. 6B. The operation of the power-up signal generating circuit of FIG. 3 will be described in comparison with that of FIG. 1 with reference to FIGS. 6A and 6B.

In both of the related art and the present invention, the power-up signal PWR_UP increases along the level of the external voltage VDD while the level of the external voltage VDD is lower than the upper limit reference voltage VT_DIS. The level of the power-up signal PWR_UP is deactivated to the ground voltage VSS when the external voltage VDD is greater than the upper limit reference voltage VT_DIS.

Thereafter, the output signal DT_LV of the level detector is activated when the level of the external voltage VDD is again less than the level of the upper limit reference voltage VT_DIS.

In the conventional power-up signal generating circuit (see FIG. 6A), the level of the power-up signal PWR_UP increases from the ground voltage VSS to the external voltage VDD in response to the signal DT_LV output by the level detector 20.

However, according to the disclosed embodiment (see FIG. 6B), the level of the power-up signal PWR_UP follows the level of the external voltage VDD when the level of the external voltage VDD decreases below the lower limit reference voltage VT_IIS.

In other words, the conventional power-up signal generating circuit repetitively activates and deactivates the power-up signal PWR_UP when the level of the external voltage VDD oscillates around the upper limit reference voltage. In such a case, the initialization operation is repetitively performed.

However, the power-up signal generating circuit of the disclosed embodiment avoids repetitively activating the power-up signal PWR_UP, even though the level of the external voltage VDD is unstable, until the level of the external voltage VDD decreases below the level of the lower limit reference voltage VT_IIS. Therefore, the initialization operation is not repeated, even in the case where the level of the external voltage VDD is unstable due to noise.

Figure 7:
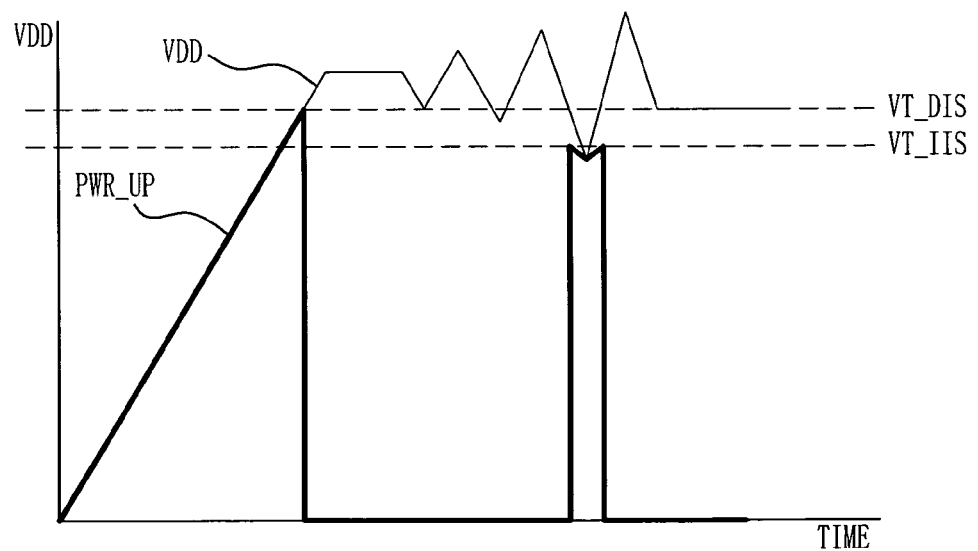
FIG. 7 is a graph illustrating a power-up signal generated by the circuit illustrated in FIG. 3 in a case where an external voltage is unstable due to noise.

FIG. 7 is a graph illustrating the power-up signal PWR_UP generated by the circuit of FIG. 3 in a case where the external voltage VDD is unstable due to the noise.

As can be seen from FIG. 7, the power-up signal generating circuit of the disclosed embodiment does not repetitively activate the power-up signal PWR_UP even though there is noise on the external voltage VDD, because there are the upper limit reference voltage VT_DIS for deactivating the power-up signal PWR_UP and the lower limit reference voltage VT_IIS for reactivating the power-up signal PWR_UP, respectively.

Thus, when there is noise on the external voltage VDD causing the external voltage VDD to oscillate around VT_DIS, the power-up signal PWR_UP is not repeatedly activated so long as the level of the external voltage VDD remains above the lower limit reference voltage VT_IIS. Additionally, the power-up signal PWR_UP is activated during the initial operation, and then deactivated once the level of the external voltage VDD increases above the level of the upper limit reference voltage VT_DIS. Once deactivated, the power-up signal PWR_UP is not again activated even if the level of the external voltage VDD is unstable due to its consumption. The RS latch prevents the undesired reactivation of the power-up signal PWR_UP. Once the power-up signal PWR_UP is deactivated, the RS latch maintains the deactivated state of the power-up signal PWR_UP until the external voltage VDD decreases below the lower limit reference voltage VT_IIS. Therefore, initialization delay and power consumption due to undesired repetitive initialization operations can be reduced.

As described above, the power-up signal PWR_UP is not repeatedly activated even in the case where the level of the external voltage VDD oscillates due to noise. Therefore, the repetitive initialization operations are prevented, thereby reducing any associated initialization delay and power consumption.

While the present invention has been described with respect to the specific embodiments, it will be apparent to those skilled in the art that various transpositions, changes, and modifications may be made without departing from the spirit and scope of the invention as defined in the following claims.

What is claimed is:

1. A power-up signal generating circuit, comprising:
    a level detector configured to deactivate a first level detection signal when a level of an external voltage increases above a first reference voltage;
    a level comparator configured to deactivate a second level detection signal when the level of the external voltage increases above a level of a second reference voltage; and
    a reentry protector configured to activate a power-up signal in response to the second level detection signal and deactivate the power-up signal in response to a deactivation of the first level detection signal,
    wherein a level of the second reference voltage is lower than that of the first reference voltage.

2. The power-up signal generating circuit as recited in claim 1, wherein the reentry protector includes:
    a first inverter configured to invert the second level detection signal;
    an RS latch configured to receive the first level detection signal as a set signal and an output signal of the first inverter as a reset signal; and
    a second inverter configured to invert an output signal of the RS latch to output the power-up signal.

3. The power-up signal generating circuit as recited in claim 2, wherein the RS latch includes a first NAND gate and a second NAND gate cross-coupled to each other.

4. The power-up signal generating circuit as recited in claim 1, further comprising a voltage divider configured to divide the external voltage to output a divided voltage, wherein the level detector and the level comparator are configured to receive the divided voltage as the external voltage.

5. The power-up signal generating circuit as recited in claim 4, wherein the level comparator includes:
    a differential amplifier configured to receive a voltage corresponding to the second reference voltage and the divided voltage as a differential input; and
    a third inverter configured to invert an output signal of the differential amplifier to output the second level detection signal.

6. The power-up signal generating circuit as recited in claim 5, wherein the level detector includes:
    a PMOS transistor having a gate connected to a ground voltage terminal, a source connected to an external voltage terminal, and a drain connected to an output node;
    an NMOS transistor having a gate receiving the divided voltage, a drain connected to the output node, and a source connected to the ground voltage terminal; and
    a buffer configured to buffer a voltage of the output node to output the first level detection signal.

7. The power-up signal generating circuit as recited in claim 6, wherein the voltage divider includes a first resistor and a second resistor connected in series between the external voltage terminal and the ground voltage terminal and outputs a voltage applied to a common node of the first and second resistors as the divided voltage.

8. The power-up signal generating circuit as recited in claim 7, further including a reference voltage generator configured to generate the voltage corresponding to the second reference voltage.

9. A method for driving a power-up signal generating circuit, the method comprising:
    detecting a level of an external voltage;
    deactivating a power-up signal, a level of which follows the level of the external voltage when activated, to a ground voltage level when the level of the external voltage increases above a level of a first reference voltage; and
    reactivating the power-up signal when the level of the external voltage falls below a level of a second reference voltage, wherein the level of the second reference voltage is lower than that of the first reference voltage.

10. The method as recited in claim 9, further comprising:
    making the power-up signal following the level of the external voltage when the level of the external voltage is lower than that of the first reference voltage at an initial operation.

11. A power-up signal generating circuit, comprising:
    a first pre-signal generating unit configured to deactivate a first level detection signal when a level of a signal corresponding to an external voltage increases above a first reference voltage;
    a second pre-signal generating unit configured to deactivate a second level detection signal when the level of the signal corresponding to the external voltage increases above a second reference voltage; and
    a main signal generating unit configured to activate a power-up signal in response to an activation of the second level detection signal, and deactivate the power-up signal in response to a deactivation of the first level detection signal,
    wherein the level of the second reference voltage is lower than that of the first reference voltage.

12. The power-up signal generating circuit as recited in claim 11, wherein the first pre-signal generating unit includes:
    a voltage divider configured to divide the external voltage to output a first divided voltage; and
    a level detector configured to detect a level of the first divided voltage and deactivate the first level detection signal when the level of the first divided voltage increases above the first reference voltage.

13. The power-up signal generating circuit as recited in claim 12, wherein the second pre-signal generating unit includes:
    a level comparator configured to deactivate the second level detection signal when the level of a divided voltage, which is one of the first divided voltage and a second divided voltage output by a second voltage divider configured to divide the external voltage, increases above the second reference voltage.

14. The power-up signal generating circuit as recited in claim 13, further including a reference voltage generating unit configured to generate the second reference voltage.

15. The power-up signal generating circuit as recited in claim 14, wherein the main signal generating unit includes:
a first inverter configured to invert the second level detection signal;
an RS latch configured to receive the first level detection signal as a set signal and an output signal of the first inverter as a reset signal; and
a second inverter configured to invert an output signal of the RS latch to output the power-up signal.

16. The power-up signal generating circuit as recited in claim 15, wherein the level comparator includes:
a differential amplifier configured to receive the second reference voltage and the divided voltage as a differential input; and
a third inverter configured to invert an output signal of the differential amplifier to output the second level detection signal.

17. The power-up signal generating circuit as recited in claim 16, wherein the level detector includes:
a PMOS transistor having a gate connected to a ground voltage terminal, a source connected to an external voltage terminal, and a drain connected to an output node;
an NMOS transistor having a gate receiving the divided voltage, a drain connected to the output node, and a source connected to the ground voltage terminal; and
a buffer configured to buffer a voltage of the output node to output the first level detection signal.

* * * * *